United States Patent [19]

Eytcheson

[11] Patent Number: 5,072,281
[45] Date of Patent: Dec. 10, 1991

[54] INTERCONNECTION LEAD HAVING INDIVIDUAL SPIRAL LEAD DESIGN

[75] Inventor: Charles T. Eytcheson, Kokomo, Ind.

[73] Assignee: Delco Electronics Corporation, Kokomo, Ind.

[21] Appl. No.: 649,133

[22] Filed: Jan. 29, 1991

Related U.S. Application Data

[63] Continuation of Ser. No. 448,453, Dec. 11, 1989, abandoned.

[51] Int. Cl.⁵ ............................................ H01L 23/48
[52] U.S. Cl. ...................................... 357/70; 357/68; 357/69
[58] Field of Search ............................. 357/70, 68, 69

[56] References Cited

U.S. PATENT DOCUMENTS

| | | | |
|---|---|---|---|
| 3,803,458 | 4/1974 | Morena, Jr. | 357/68 |
| 3,902,148 | 8/1975 | Drees et al. | 357/69 |
| 3,947,867 | 3/1976 | Duffek et al. | 357/70 |
| 4,529,999 | 7/1985 | Bender et al. | 357/68 |

Primary Examiner—Eugene R. LaRoche
Assistant Examiner—Reginald A. Ratliff
Attorney, Agent, or Firm—Cary W. Brooks

[57] ABSTRACT

An interconnection lead is provided for electrically and physically connecting a plurality of bonding sites on an integrated circuit to a plurality of external electrical connections. The interconnection lead contains a plurality of individual electrical leads which have been formed so as to have an arcuate shape at the region where each individual lead is bonded to the integrated circuit. In addition, the arcuate shapes are all of similar length and all rotate in the same direction around the integrated circuit. This design provides enhanced strain relief during use, since the arcuate shapes permit rotation of the integrated circuit during mounting or excessive lead stress.

11 Claims, 1 Drawing Sheet

INTERCONNECTION LEAD HAVING INDIVIDUAL SPIRAL LEAD DESIGN

This is a continuation of application Ser. No. 07/448,453 filed on Dec. 11, 1989, now abandoned.

The present invention generally relates to electrical interconnections which are suitable for electrically connecting a plurality of bonding sites on an integrated circuit to a plurality of external connections. More particularly, this invention relates to an electrical interconnection design wherein each individual lead within the interconnection is formed so as to have an arcuate region which rotates around the integrated circuit all in the same direction thereby providing enhanced strain relief and corresponding improved performance during use.

BACKGROUND OF THE INVENTION

Many methods are known for forming the electrical interconnections between an integrated circuit and the supporting substrate. Tape automated bonding (TAB) is one commonly known method for forming these such electrical interconnections. A TAB tape is provided which comprises a plurality of individual long, slender inner leads attached to, and extending out from, generally wider, larger outer leads. There may be many of these inner/outer lead configurations on a single TAB tape.

An individual inner lead on the TAB tape is generally bonded to the integrated circuit at a bonding pad so as to form an inner lead bond. There are typically many of these inner lead bonds on a single integrated circuit. The inner lead bonds are formed by first depositing a gold bump, or other suitable material, on either the end of the TAB tape inner lead or on the integrated circuit itself. The integrated circuit and TAB tape inner leads, which are generally copper, are then aligned and simultaneously thermocompression gang bonded.

After bonding between the integrated circuit and inner leads is complete, the integrated circuit is excised from the TAB tape at a point beyond the outer lead, so that the outer lead remains attached to the bonded inner lead and integrated circuit. The integrated circuit assembly is subsequently mounted on the substrate, if this has not already been done, and the outer leads are appropriately bonded to the substrate.

Strain relief must be provided in the interconnection lead between the integrated circuit and supporting substrate, so as to compensate for any thermal or physical stresses arising during use. Generally strain relief is provided by forming the individual interconnection leads in a serpentine manner, as shown in the accompanying FIG. 1, thereby permitting expansion of the individual leads during use.

However, a shortcoming associated with the use of these individual serpentine leads is that the associated stresses become unbalanced during use due to the varying lead lengths and positioning of each lead from different directions. This unbalanced state results in higher failure rates for the individual bonds and correspondingly for the device. In addition, the current serpentine design results in increased lead stress during mounting of the integrated circuit to a substrate or other surface, since the varying lengths of each lead again result in an unbalanced stress load during mounting.

Therefore, it would be advantageous to provide an electrical interconnection lead which provides for balanced stress relief during use and mounting of the integrated circuit.

SUMMARY OF THE INVENTION

It is an object of the present invention to provide an electrical interconnection lead for electrically and physically connecting an integrated circuit to a plurality of external connections.

It is a further object of this invention that such electrical interconnection lead provide enhanced strain relief during use of the integrated circuit.

In accordance with a preferred embodiment of this invention, these and other objects and advantages are accomplished as follows.

An interconnection lead is provided for electrically and physically connecting a plurality of bonding sites on an integrated circuit to a plurality of external electrical connections. The interconnection lead contains a plurality of individual electrical leads. Each of the individual electrical leads is formed so as to have an arcuate shape at the region where each individual lead is bonded to the integrated circuit. In addition, the arcuate shapes are all of similar length and all rotate in the same direction around the integrated circuit.

This design provides enhanced strain relief during use, since the arcuate shapes permit rotation of the integrated circuit during mounting or excessive applied lead stress. Because the leads are all disposed so as to rotate in the same direction around the integrated circuit, the applied stress is more balanced than with previous methods.

Other objects and advantages of this invention will be better appreciated from the following detailed description thereof.

BRIEF DESCRIPTION OF THE DRAWINGS

The above and other advantages of this invention will become more apparent from the following description taken in conjunction with the accompanying drawings wherein like references refer to like parts and wherein.

DETAILED DESCRIPTION OF THE INVENTION

An interconnection lead is provided for electrically and physically connecting a plurality of bonding sites on an integrated circuit to a plurality of external electrical connections. The interconnection lead contains a plurality of individual electrical leads. Each of the individual electrical leads is formed so as to have an arcuate shape at the region where each individual lead is bonded to the integrated circuit. In addition, the arcuate shapes are all of similar length and all disposed to rotate in the same direction around the integrated circuit.

Figure 1:
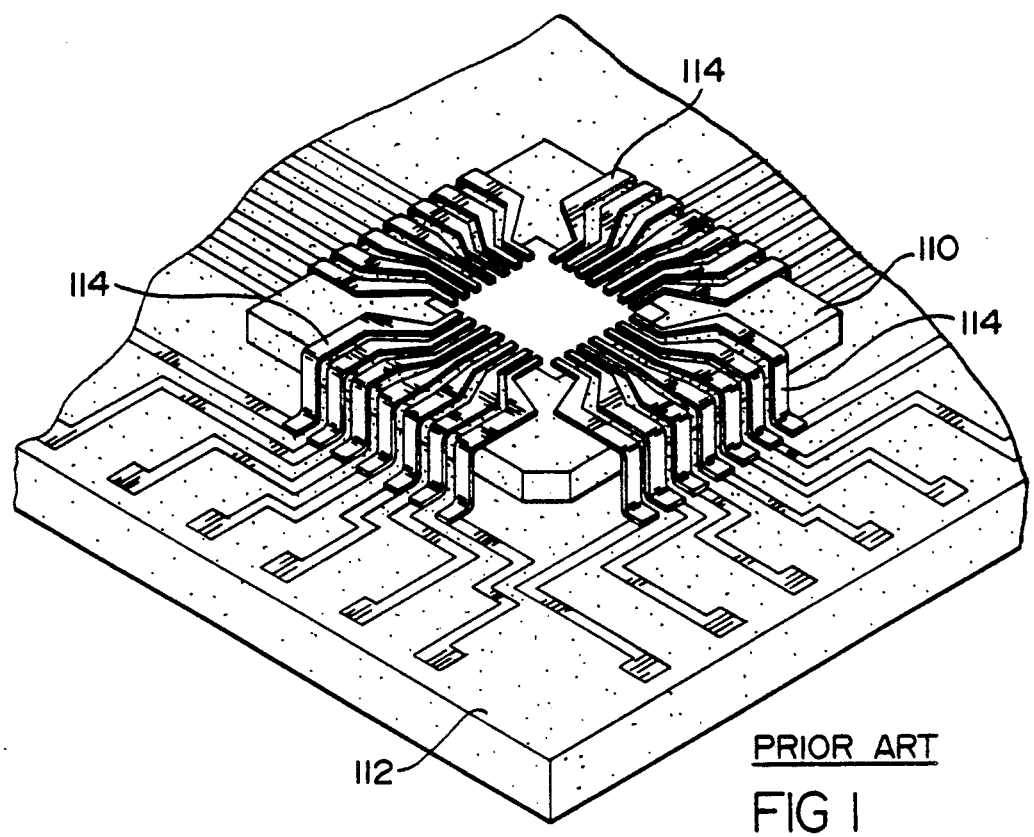
FIG. 1 illustrates a conventional interconnection lead design generally used throughout the art.
Figure 2:
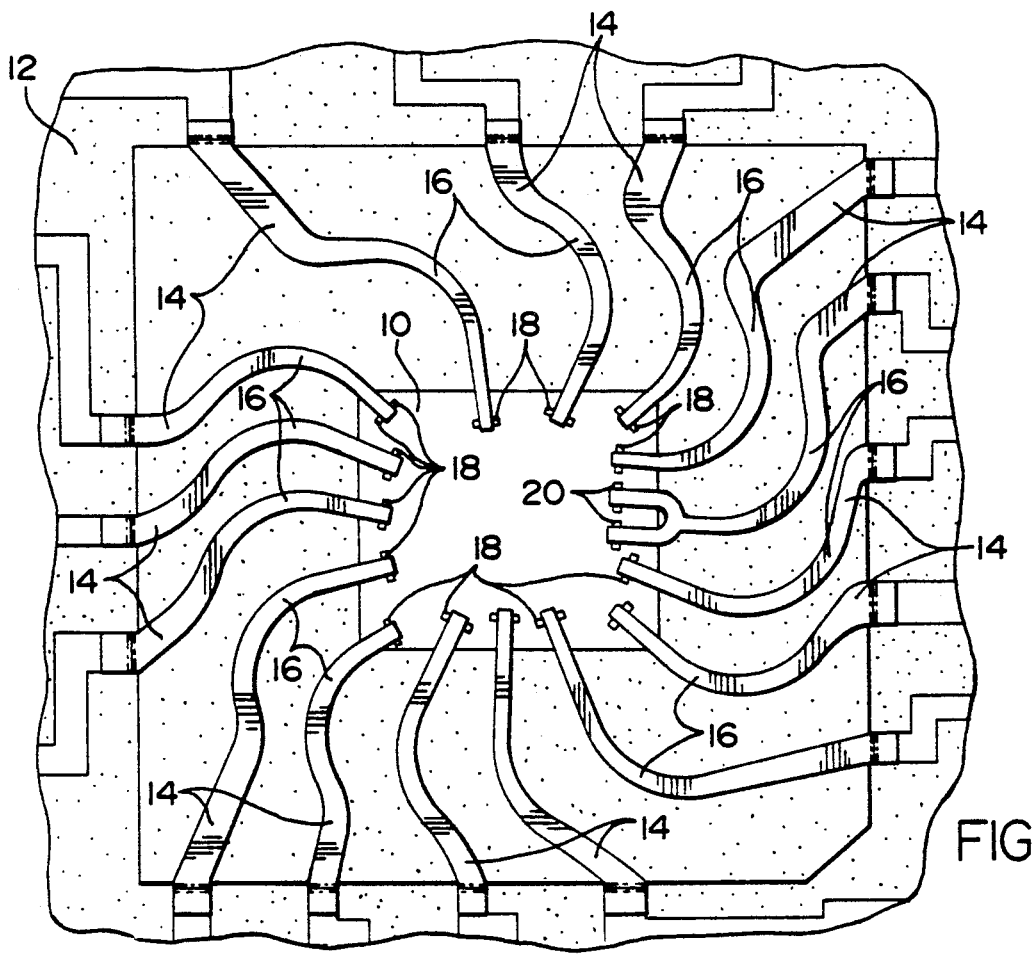
FIG. 2 illustrates an interconnection lead design in accordance with a preferred embodiment of this invention.

As shown in FIG. 2, an integrated circuit 10 is electrically and physically connected to a surrounding substrate 12 of appropriate material by means of a plurality of electrically conductive leads 14. Each electrically conductive lead 14 is formed so as to have an arcuate shape 16 at the region where the lead 14 is bonded to the integrated circuit 10. The arcuate shapes 16 are generally of similar length and are disposed to as to all rotate generally in the same direction around the integrated circuit 10.

This electrical interconnection design provides enhanced strain relief during use of the integrated circuit 10, since the arcuate shapes 16 permit rotation of the integrated circuit 10 during mounting or excessive stress. With this design, the leads rotate in a similar direction during applied stress instead of in various directions as with conventional designs. This design results in a more balanced stress load around the integrated circuit, thereby improving the durability of the individual leads and correspondingly the integrated circuit.

In particular, if the integrated circuit remains free floating after being bonded to the individual leads 14, such as with tape automated bonding methods, the integrated circuit is free to rotate during any applied stress, thereby advantageously reducing stress to the leads and integrated circuit. The ability to rotate equally balances the applied stress between all of the integrated circuit bonds. Alternatively, if the integrated circuit is mounted to a substrate or other surface, such as a heat sink, this design compensates for any differences in vertical tolerances. This is accomplished since the spiral leads twist during the vertical down setting and the integrated circuit rotates with equal deflection to each of the individual leads. This rotational motion results in balanced stresses to each integrated circuit bond. Even after mounting, the twisted, spiral lead design still retains adequate length and curvature to provide good strain relief.

The plurality of individual leads 14 are bonded to the integrated circuit 12 at the arcuate regions 16. As illustrated the arcuate shapes 16 may vary in degree of curvature. They may range from a slight amount of curvature to a larger degree of curvature approaching a semicircular shape. The degree of curvature will vary depending on the position and location of the electrical connection in relation to its corresponding area to be bonded on the integrated circuit 10. Regardless of the degree of curvature, it is important that all arcuate shapes 16 are disposed so as to rotate in the same direction around the integrated circuit. This is necessary for providing enhanced strain relief. In addition, as clearly illustrated in FIG. 2, a single electrical lead 14 having an arcuate shape 16 may provide two or more regions 20 for bonding with the integrated circuit.

This electrical interconnection design provides enhanced strain relief during use of the integrated circuit. Although this invention has been described in terms of a preferred embodiment, alternative embodiments are also possible and considered within the scope of this invention, such as the application of these techniques to an alternative bonding method such as flexible circuitry or to an integrated circuit being mounted to a printed circuit board.

Accordingly, our invention is to be limited only by the following claims.

The embodiments of the invention in which an exclusive property or privilege is claimed are defined as follows:

1. An integrated circuit chip, an electrically conductive tape and substrate combination comprising a plurality of individual electrically conductive tape leads for electrically connecting a plurality of bonding sites on said integrated circuit chip to a plurality of external electrical connections; said integrated circuit chip having a rectangular shape; each of said individual leads having a bonding end bonded to said integrated circuit chip, an opposite end secured to the top surface of a substrate, and a free floating middle section disposed therebetween having a nonuniform arcuate region, so that each lead curves clockwise or counterclockwise around said rectangularly shaped integrated circuit chip and said opposite end secured to said substrate is laterally displaced a distance from said bonding end.

2. A combination as set forth in claim 1 wherein said integrated circuit chip is connected only to said individual leads so as to be free to rotate in response to applied stress.

3. A combination as set forth in claim 1 wherein said integrated circuit chip is secured to a heat sink down set to a position below the top surface of said substrate.

4. A combination as set forth in claim 1 wherein said integrated circuit chip is positioned below the top surface of said substrate.

5. A method of downsetting an integrated circuit chip/electrical interconnection combination so as to reduce the stress applied to the electrical interconnection during downsetting, comprising the steps of:
providing a first and second substrate;
providing a rectangular shaped integrated circuit;
providing an electrical interconnection comprising a plurality of individual electrically conductive tape leads for electrically connecting a plurality of bonding sites on said rectangular shaped integrated circuit chip to a plurality of external electrical connections; each of said individual leads having a bonding end bonded to said integrated circuit chip, an opposite end secured to the top surface of said first substrate, and a free floating middle section disposed therebetween having a nonuniform arcuate region, so that each lead curves clockwise or counterclockwise around said rectangularly shaped integrated circuit chip and said opposite end secured to said substrate is laterally displaced a distance from said bonding end; and
downsetting said integrated circuit chip to said second substrate positioned below the top surface of said first substrate and rotating said integrated circuit chip to equally deflect each of said leads and balance the stresses to each integrated circuit bond.

6. An integrated circuit chip, electrically conductive interconnect, and substrate combination comprising:
a substrate;
an integrated circuit chip having a rectangularly shaped top surface;
an electrically conductive interconnect having a plurality of electrically conductive leads, each lead having a top surface and having a first end bonded to said integrated circuit chip and a second end secured to said substrate, and having a curved portion between said first and second ends having a nonuniform radius of curvature along the top surface of said lead, and having a first linear portion contiguous said curved portion and extending towards said first end, and having a second linear portion contiguous said curved portion and extending towards said second end;
said plurality of electrically conductive leads being constructed and arranged so that there is a nonuniform spacing between said first ends of said leads bonded to said integrated circuit chip, and so that there is a nonuniform spacing between said second ends of said leads secured to said substrate; and
wherein a longitudinal axis of the top surface of said first linear portion is not parallel to a longitudinal axis of the top surface of said second linear portion of each lead.

7. A combination as set forth in claim 6 wherein each lead is positioned to curve clockwise or counterclockwise around said rectangular shaped top surface of said integrated circuit chip.

8. A combination as set forth in claim 6 wherein said integrated circuit chip is secured to a heatsink downset so that the top surface of the integrated circuit chip is below the top surface of the substrate.

9. A combination as set forth in claim 6 wherein said integrated circuit chip is free-floating so that said leads equally deflect in response to applied stress and so that a balance and substantially equal stress is applied to said bond securing the lead to the integrated circuit chip.

10. A combination comprising a plurality of individual electrically conductive leads for electrically connecting a plurality of bonding sites on an integrated circuit chip to a plurality of external electrical connections; said integrated circuit chip having a rectangularly shaped top surface; each of said individual leads having a first end bonded to said integrated circuit chip adjacent an associated side edge of the rectangular shaped top surface, and having a second end secured to a top surface of a substrate, and having a free-floating middle disposed therebetween having a nonuniform arcuate region, so that each lead curves clockwise or counterclockwise around said rectangularly shaped top surface and said second end secured to said substrate is laterally displaced, with respect to an associated side of the top surface of said chip, a distance from said first end.

11. A method of downsetting an integrated circuit/electrically interconnection combination so as to reduce the stress applied to electrical leads of the electrical interconnection and to bonds bonding the leads to the integrated circuit chip during the downsetting step comprising the steps of:

providing a first and second substrate;

providing an integrated circuit chip having a rectangularly shaped top surface;

providing an electrical interconnection comprising a plurality of individual electrically conductive leads for electrically connecting a plurality of bonding sites on said integrated circuit chip to a plurality of external electrical connections;

each of said individual leads having a first end bonded to an integrated circuit chip adjacent an associated side edge of the rectangularly shaped top surface, and having a second end secured to the top surface of said first substrate, and having a free-floating middle section disposed therebetween having a nonuniform arcuate region, and so that said second end secured to said substrate is laterally displaced, with respect to an associated side edge of the top surface of said chip, a distance from said first end; and downsetting said integrated circuit chip to the top surface of said second substrate positioned below the top surface of said first substrate including the step of rotating said integrated circuit chip to equally deflect each of said leads and balance the stresses to each bond bonding said first end to said integrated circuit chip during the downsetting step.

* * * * *